US012069389B2

(12) United States Patent
Segovia de la Torre et al.

(10) Patent No.: US 12,069,389 B2
(45) Date of Patent: Aug. 20, 2024

(54) COLUMN SHARING ADC FOR IMAGE SENSORS AND METHOD OF OPERATION

(71) Applicant: Teledyne Innovaciones Microelectrónicas, SLU, Seville (ES)

(72) Inventors: Jose Angel Segovia de la Torre, Seville (ES); Ana Gonzalez Marquez, Seville (ES); Rafael Dominguez Castro, Seville (ES); Maria Dolores Pardo Cuenca, Seville (ES); Antonio Ortiz De Galisteo Duarte, Seville (ES)

(73) Assignee: TELEDYNE INNOVACIONES MICROELECTRÓNICAS, SLU, Seville (ES)

( * ) Notice: Subject to any disclaimer, the term of this patent is extended or adjusted under 35 U.S.C. 154(b) by 112 days.

(21) Appl. No.: 17/980,194

(22) Filed: Nov. 3, 2022

(65) Prior Publication Data

US 2023/0147629 A1    May 11, 2023

(30) Foreign Application Priority Data

Nov. 5, 2021 (EP) ..................................... 21306556

(51) Int. Cl.
| | |
|---|---|
| *H04N 25/78* | (2023.01) |
| *H04N 25/42* | (2023.01) |
| *H04N 25/75* | (2023.01) |
| *H04N 25/77* | (2023.01) |

(52) U.S. Cl.
CPC ............. *H04N 25/75* (2023.01); *H04N 25/42* (2023.01); *H04N 25/77* (2023.01)

(58) Field of Classification Search
CPC ........ H04N 23/75; H04N 23/78; H03M 1/825

USPC ......................................................... 348/294
See application file for complete search history.

(56) References Cited

U.S. PATENT DOCUMENTS

| | | | |
|---|---|---|---|
| 2007/0002134 A1 | 1/2007 | Ishihara et al. | |
| 2015/0062394 A1* | 3/2015 | Ikeda ................... | H04N 25/778 |
| | | | 348/301 |
| 2017/0201702 A1 | 7/2017 | Niwa et al. | |
| 2018/0248559 A1* | 8/2018 | Ahmad ................ | H03M 1/129 |

(Continued)

OTHER PUBLICATIONS

Vatteroni et al., "Smart Optical CMOS Sensor for Endoluminal Applications", Proceedings of the Eurosensors XXIII conference, Sep. 2009, pp. 1271-1274, Procedia Chemistry 1, Elsevier B.V., Amsterdam, Netherlands.

(Continued)

*Primary Examiner* — Anthony J Daniels
(74) *Attorney, Agent, or Firm* — Haynes and Boone, LLP

(57) ABSTRACT

An analogue to digital converter is provided for digital imaging devices, in which a pixel column is sampled by a respective capacitor.
In a reset phase of operation, each pixel in the row under consideration is reset, and an operational amplifier operating in a voltage follower mode is coupled to all the sampling capacitors in parallel to obtain the reset values of the pixels sensors of that row, and the in an imaging phase of operation, the inverting input of the operational amplifier operating in a comparator mode is coupled to each capacitor in turn after activating the respective pixel sensor, while exposing the non inverting signal to an analog ramp reference voltage so that the timing of the toggling of the operational amplifier reflects the value of the pixel under consideration, corrected for the reset value.

14 Claims, 7 Drawing Sheets

(56) References Cited

U.S. PATENT DOCUMENTS

| | | |
|---|---|---|
| 2019/0068210 A1* | 2/2019 | Kim ................... H03M 1/145 |
| 2020/0053307 A1 | 2/2020 | Cho et al. |
| 2020/0099879 A1 | 3/2020 | Kim |
| 2023/0027347 A1* | 1/2023 | Black ................... G01J 5/24 |
| 2024/0031691 A1* | 1/2024 | Torii ................... H04N 25/78 |

OTHER PUBLICATIONS

Wäny et al.., "Ultrasmall Digital Image Sensor for Endoscopic Applications", Proc. Int. Image Sensor Workshop, Jun. 2009, pp. 1-4, Awaiba, Maderia, Portugal.

Itoh et al., "A 2.6mW 2fps QVGA CMOS One-chip Wireless Camera with Digital Image Transmission Function for Capsule Endoscopes", 2006 IEEE International Symposium on Circuits and Systems, May 2006, pp. 3353-3356, IEEE, Kos, Greece.

Sousa et al., "NanEye—An Endoscopy Sensor With 3-D Image Synchronization", IEEE Sensors Journal, Nov. 2016, 8 pages, PP, Funchal, Portugal.

\* cited by examiner

COLUMN SHARING ADC FOR IMAGE SENSORS AND METHOD OF OPERATION

CROSS REFERENCE TO RELATED APPLICATIONS

This application claims priority to European Patent Application No. EP21306556.8 filed Nov. 5, 2021 and entitled "COLUMN SHARING ADC FOR IMAGE SENSORS AND METHOD OF OPERATION," which is incorporated herein by reference in its entirety.

FIELD OF THE INVENTION

The present invention relates to image sensor circuits, and in particular to Analogue to Digital converter components of such circuits.

BACKGROUND OF THE INVENTION

There exist many applications where it is desirable to minimize sensor dimensions. Examples include endoscopy, medical sensing, machine inspection, surveillance and the internet of things. Image sensors for endoscopy systems and similar contexts require some specific features that are not be satisfied by prior art out-the-shelf image sensors available in the market. These include
  1. The image sensor size is very small. Depending on the pixel array resolution of the endoscopy, the sensor size can go from 3×3 mm² to 1×1 mm², depending on the final functionality of the endoscope: bronchoscopy, colonoscopy, laparoscopy, laryngoscopy . . . .
  2. The pixel size is also very small in order to maximize the pixel array resolution. The pixel size is usually from 1×1 µm² to 3×3 µm².
  3. The periphery circuitry area should be very small, in order to maximize the pixel array resolution in the same area.
  4. The power consumption should be very small, since the sensor goes inside human cavities, and share space with other system like illumination and others medical tools.
  5. The required frame rate usually goes from 60 fps to 120 fps. The digital image should be transmitted by serial link reducing the number of ports, and consequently the number of cables.

In the case of endoscopy sensors, there are still many image sensors with analog output, because it requires lower number of internal elements, being much easier to reduce the periphery area.

However, there are important advantages of using endoscope image sensors with digital output:
  1. No need for companion device to transform the output to digital code, reducing the final cost of the system.
  2. The digital output is much more reliable against interferences, because the receiver only needs to decide between two logic levels. Then if any device, like a scalpel, is generating electrical noise the digital output can accept higher levels of interference, even more when the output is sent in differential digital way.
  3. The digital output allows transmitting higher data rate up to 3 Gbps.
  4. The data digitalization is done on-chip, then the image quality does not depend on external elements.

CMOS Image Sensors (CIS) are basically composed of two main blocks: a pixel matrix and a readout circuit. The pixel array is comprised of a plurality of pixel elements disposed in rows and columns.

The readout channel digitalizes the information inside the pixel array, and generates the digital image that contains the information of the scene. Currently, most of the image sensors have digital output, it means the device includes AD converters optimizing the number of elements out of the sensor.

The readout circuit scans the pixel matrix; and then outputs the contents of the scene information. The pixel output consists of two components at the reset level, which is the level without charge and the signal level, resulting from the integration of the charge onto the reset level. Traditionally, the readout circuit has consisted of a Correlated-Double Sampling (CDS) amplifier, to compute the pixel signal and amplify it to the required level, and an output buffer, to bring the analog signal out of the sensor, where it is conditioned and digitized. Most modern implementations include the analog-to-digital conversion (ADC) on chip, so that the CDS amplifier is often followed by an ADC block.

In many applications, as the speed requirements increase, the number of readout channels (each one conceptually composed of CDS amplifier plus ADC) needs to be increased as well. Theoretically, the achievable frame rate of a CIS increases linearly with the number of readout elements working in parallel. In fact, these can be seen as a single readout channel with effective speed boosted by the number of replicas.

In practice, this parallelism can be increased as much as needed, although there are practical limitations as routing congestion or device placement congestion. Today many CIS employ a readout element per pixel column, so that such readout element is in charge of processing the signal coming from pixels in a single column. It can be extended to N readout elements per columns, increasing the CIS speed by N in a row basis. The time inverted in output of one row data is used in the ADC to convert the data; this time is known as row time. And one of the limitations for the row time is the ADC precision. The higher precision, the longer time is needed to convert a signal.

There are typically two approaches in AD converters in endoscopy:
  1. Architecture based on one high speed ADC, the converter is common for all columns of the pixel matrix and sampled and held per column
  2. Architecture based on multiple converters, one per column. This architecture is able to reach higher speed at the cost of more area.

Typical solutions known in the state of the art include those described in US20070002134A1, "SIGNAL PROCESSSING DEVICE FOR ENDOSCOPE", Olympus corp., in the article by M. Vatteroni, et al., entitled "Smart optical CMOS sensor for endoluminal applications", Eurosensors XXIII, 2009, in the article by M. Wäny, et al., entitled "Ultrasmall digital image sensor for endoscopic applications", in Proc. Int. Image Sensor Workshop, June 2009, pp. 1-4. in the article by S. Itoh, S. Kawahito, S. Terakawa, entitled "A 2.6 mW 2 fps QVGA CMOS one-chip wireless camera with digital image transmission function for capsule endoscopes", and in the article by M. Wäny, et al., entitled "NanEye—An Endoscopy Sensor With 3-D Image Synchronization", IEEE sensors journal, 2017.

For example in the implementation proposed in the article by M. Vatteroni, et al., entitled "Smart optical CMOS sensor for endoluminal applications", Eurosensors XXIII, 2009, there is one AD on the right side of the array. The fact of using one unique ADC converter adds more complexity and non-optimum implementation, because it adds the need to use a column decoder to select the column to be converted. In the case of doing true CDS, sample and hold per column are needed, consuming extra area, and it is difficult to achieve the strong requirement in endoscopy where the pixel array must be centered. When using one ADC this requirement is quite complex, since the ADC occupies an important part of the periphery area.

As soon as the number of replicas, N, increases, the occupied area increases at least nearly in a linear manner.

The area increment implied by the prior art approaches above is ill adapted to these contexts, and it is desired to provide an architecture overcoming these limitations.

SUMMARY OF THE INVENTION

In accordance with a first aspect of the present disclosure there is provided an analogue to digital converter for a digital imaging device comprising a plurality of pixel sensors arranged in a two dimensional matrix comprising a plurality of columns of pixel sensors, said analogue to digital converter comprising: a plurality of read-out capacitors, each read-out capacitor being associated with a respective column of pixel sensors, a first plurality of addressable output switches, wherein each of the first plurality of addressable output switches is arranged to switchably couple the output of a pixel sensor in a column of the pixel sensor matrix to a first terminal of the read-out capacitor associated with that column; an operational amplifier comprising an inverting input coupled to second terminals of the plurality of read-out capacitors and a non-inverting input; a ramp signal source switchably coupled to the non-inverting input of the operational amplifier, wherein the ramp signal source is configured to output a ramping reference voltage; a mode selection switch arranged to switchably couple and de-couple the inverting input of the operational amplifier to a common reference voltage or the output of the operational amplifier; and a controller configured to control the addressable switches such that the analogue to digital converter sequentially operates in a first mode of operation during which pixel sensors in a selected row of the pixel sensor matrix output reset values and a second mode of operation during which the pixel sensors in the selected row of the pixel sensor matrix output signal values, wherein:

a. in the first mode of operation the first plurality of addressable output switches are closed such that the pixel sensor outputs in the selected row and in each column are simultaneously connected to the first terminals of the read-out capacitors, and the mode selection switch is closed such that the inverting input of the operational amplifier is connected to the common reference voltage or to the output of the operational amplifier, such that the outputs of the pixel sensors in the row are read out in parallel and the reset values of the pixels sensors in the row are stored in their respective read-out capacitor, and b. in the second mode of operation, the mode selection switch is opened to de-couple the inverting input from the output of the operational amplifier or the reference voltage such that the operational amplifier operates in a comparator mode, and the first plurality of addressable output switches are sequentially closed to sequentially couple the outputs of the pixel sensors in each column and in the selected row to the first terminals of their respective read-out capacitors whilst the second terminals of the read-out capacitors are coupled to the inverting input of the operational amplifier and the non-inverting input of the operational amplifier is coupled to the ramp signal source, such that for each pixel sensor whose output is sequentially coupled to the first terminal of its associated read-out capacitor, the value on the inverting input of the operational amplifier corresponds to the reset value stored in the respective read-out capacitor minus the output signal of the pixel sensor in the respective column and said value on the inverting input of the operational amplifier is rendered as a digital output value encoded by the timing with which the output of the operational amplifier toggles from one output extremum to the other.

As described above, the analogue to digital converter is configured to read out the reset values of each of the pixel sensors in a selected row in parallel with each other. This is enabled by providing a read-out capacitor per column such that the reset values of each of the columns can be read out and stored in the respective read-out capacitors in parallel. It will be appreciated that this parallel read out of reset values in different columns provides a significant time saving when compared to alternative approaches in which reset values in different columns are read out sequentially.

The analogue to digital converter is further configured to perform correlated double sampling in the analogue domain. That is, for each pixel sensor the analogue to digital converter is configured to generate an analogue signal which represents a difference between a reset value and a signal value output from the pixel sensor. Correlated double sampling in the analogue domain is enabled by storing the reset values in the read-out capacitors during the first mode of operation and then during the second mode of operation: sequentially coupling the output of the pixel sensors in each column and in the selected row to the first terminals of their respective read-out capacitors whilst the second terminals of the read-out capacitors are coupled to the inverting input of the operational amplifier. Consequently an analogue signal representative of the difference between the reset value of a given pixel which is stored in a read-out capacitor and the pixel output during the second mode of operation is provided at the inverting input of the operational amplifier. The analogue signal representative of the difference between a reset value and a signal value output from the pixel sensor (which is provided at the inverting input of the operational amplifier during the second mode of operation) is converted to a digital output.

By performing correlated double sampling in the analogue domain only one conversion of an analogue signal to a digital output needs to be performed per pixel sensor (and per exposure). This significantly reduces the number of analogue to digital conversions which need to be performed, when compared, for example, to an alternative approach in which correlated double sampling is performed in the digital domain. For example, in some alternative approaches a reset value and a signal value for each pixel may be separately converted into digital outputs for each pixel and the digital outputs may be subtracted from each other to perform correlated double sampling in the digital domain. According to such approaches at least two conversions of analogue signals to digital outputs need to be performed per pixel sensor (and per exposure). It will be appreciated therefore that performing correlated double sampling in the analogue domain and disclosed herein may provide significant time saving when compared to alternative approaches in which correlated sampling is performed in the digital domain.

The analogue to digital converter includes a single operational amplifier for converting outputs from a plurality of columns. Such an arrangement may enable significant power and/or space savings in an image sensor. The use of a single analogue to digital converter for converting outputs from a plurality of columns means that output from different columns are converted sequentially. However, any additional time expense which results from sequential conversion of different columns is counteracted by the parallel read-out of reset values and the performance of correlated double-sampling in the analogue domain as described above. The devices and methods provided herein therefore provide an advantageous balance between operation speed and space and power consumption considerations in an imaging device.

In the first mode of operation when the mode selection switch is closed such that the inverting input of the operational amplifier is connected to the common reference voltage or to the output of the operational amplifier, the operational amplifier may operate in a voltage follower mode.

As was described above, in the second mode of operation, the operational amplifier operates in a comparator mode. An analogue signal (representative of a difference between a reset value and a signal value output from a pixel sensor) is provided at the inverting input of the operational amplifier. At the same time the ramp signal source is coupled to the non-inverting input of the operational amplifier. The ramp signal source outputs a ramping reference voltage. That is, the ramp signal source outputs a reference voltage which increases or decreases as a function of time (and hence "ramps" with time). When operating in comparator mode, the output of the operational amplifier is a first output extremum (e.g. negative saturation or positive saturation) when the signal provided at the inverting input is greater then the signal provided at the non-inverting input and is a second output extremum (e.g. the other of negative saturation or positive saturation). The output of the operational amplifier therefore toggles from one output extremum to the other (e.g. from negative saturation or positive saturation) when the ramping reference voltage crosses the analogue signal provided at the inverting input of the operational amplifier. The time at which the output of the operational amplifier toggles from one output extremum to the other is therefore representative of the analogue signal provided at the inverting input of the operational amplifier. The timing at which the output of the operational amplifier toggles from one output extremum to the other may be encoded into a digital signal, for example, by transferring the value of a digital counter into a digital register when the output of the operational amplifier toggles from one output extremum to the other.

The analogue to digital converter may further comprise a second plurality of addressable output switches. Each of the second plurality of output switches may be arranged to switchably couple a second terminal of a read-out capacitor of the plurality of read-out capacitors to the inverting input of the operational amplifier. In the first mode of operation, the second plurality of output switches may be closed in parallel with each other such that each of the second terminals of the read-out capacitors are coupled to the inverting input of the operational amplifier simultaneously and during the parallel read out of the reset values of the pixel sensors. In the second mode of operation, the second plurality of output switches may be sequentially closed in order to sequentially couple each of the second terminals of the read-out capacitors to the inverting input of the operational amplifier. For example, the second plurality of output switches may be sequentially closed substantially in unison with the respective first plurality of output switches. For example, an output switch of the first plurality of output switches and an output switch of the second plurality of output switches, which are associated with the same read-out capacitor may be closed at substantially the same time during the second mode of operation.

The output of the operational amplifier may be provided to a digital output register synchronized with the sequential coupling of the outputs of the pixel sensors in each column and in the selected row to the first terminals of their respective read-out capacitors.

The analogue to digital converter disclosed herein allows a single digital output register to be included per analogue to digital converter. As was described above, in the second mode of operation, outputs of the pixel sensors in the respective column and in the selected row are sequentially coupled to the first terminals of their respective read-out capacitors. Furthermore, the operational amplifier (operating as a comparator in the second mode of operations) sequentially converts the analogue signal at the inverting input (which is representative of the difference between the reset value of a given pixel and the signal value of that pixel) of the operational amplifier to a digital value. The digital output register latches the digital value output during each sequential conversion until an analogue to digital conversion has been performed and a digital output value stored in the register for each pixel sensor in the selected row. A new row may then be selected and pixel sensor outputs in the row may then sequentially converted and stored in the digital register using the same analogue to digital converter and digital output register as described above.

According to a second aspect of the present disclosure there is provided a digital imaging device comprising the analogue to digital converter, wherein the imaging device is configured to select each row of the matrix of pixel sensors in turn and operate the converter in the first mode and the second mode for each row such that the analogue to digital converter outputs digital values representing the reset value minus the signal value of each pixel in a selected row in turn, before proceeding correspondingly with the next row, until a digital value is output for every pixel in the matrix.

A single digital to analogue converter and/or a single digital output register may be used to convert and store an output value for each pixel in the matrix.

Each pixel sensor may comprise a 4 transistor per pixel sensor.

The digital imaging device may further comprise a pixel controller configured to control the pixel sensors to output a reset value during the first mode of operation of the digital to analogue converter and to output a signal value during the second mode of operation of the digital to analogue converter.

According to a third aspect of the present disclosure there is provide a digital imaging system comprising the digital imaging device and further comprising an imaging controller, configured to: in a first phase of operation, to reset each said pixel sensor in a selected row, and to operate the analogue to digital converter in the first mode of operation; and in a second phase of operation, operate the analogue to digital converter in the first mode of operation, and capture a digital output from the analogue to digital converter.

The imaging controller may be further configured to repeat said first phase and said second phase for each row in the matrix.

The controller, the pixel controller and/or the imaging controller may comprise the same controller. Alternatively, the controller, the pixel controller and/or the imaging controller may be embodied by a plurality of different controllers.

The digital imaging system may further comprise a shift register coupled to the output of the analogue to digital converter and configured to serialize the data output from the analogue to digital converter.

According to a fourth aspect of the present disclosure there is provide a method of operating an analogue to digital converter for a digital imaging device comprising a plurality of pixel sensors arranged in a two dimensional matrix comprising a plurality of columns of pixel sensors, wherein the analogue to digital converter comprises: a plurality of read-out capacitors, each read-out capacitor being associated with a respective column of pixel sensors, an operational amplifier comprising an inverting input coupled to second terminals of the plurality of read-out capacitors and a non-inverting input; and a ramp signal source switchably coupled to the non-inverting input of the operational amplifier, wherein the method comprises sequentially operating the analogue to digital converter in a first mode of operation during which pixel sensors in a selected row of the pixel sensor matrix output reset values and a second mode of operation during which the pixel sensors in the selected row of the pixel sensor matrix output signal values, wherein:

a. the first mode of operation comprises: connecting the pixel sensor outputs in the selected row and in each column to first terminals of the read-out capacitors in parallel with each other, and connecting the inverting input of the operational amplifier to a common reference voltage or to the output of the operational amplifier, such that the outputs of the pixel sensors in the row are read out in parallel and the reset values of the pixels sensors in the row are stored in their respective read-out capacitor, and b. the second mode of operation comprises: de-coupling the inverting input from the output of the operational amplifier or the reference voltage such that the operational amplifier operates in a comparator mode, and sequentially coupling the outputs of the pixel sensors in each column and in the selected row to the first terminals of their respective read-out capacitors whilst the second terminals of the read-out capacitors are coupled to the inverting output of the operational amplifier and the non-inverting input of the operational amplifier is coupled to the ramp signal source which outputs a ramping reference voltage, such that for each sequentially coupled pixel sensor output, the value on the inverting input of the operational amplifier corresponds to the reset value stored in the respective read-out capacitor minus the output signal of the pixel sensor in the respective column and said value on the inverting input of the operational amplifier is rendered as a digital output value encoded by the timing with which the output of the operational amplifier toggles from one output extremum to the other.

According to a fifth aspect of the present disclosure there is provide a method of operating a digital imaging device comprising the steps of the method of the fourth aspect, said method of operating a digital imaging device comprising: selecting each row of the matrix of pixel sensors in turn and operating the converter in the first mode and the second mode for each row such that the analogue to digital converter outputs digital values representing the reset value minus the signal value of each pixel in a selected row in turn, before proceeding correspondingly with the next row, until a digital value is output for every pixel in the matrix.

The method may further comprise controlling the pixel sensors in a selected row to output reset values during the first mode of operation of the analogue to digital converter; and controlling the pixel sensors in the selected row to output signal values during the second mode of operation of the analogue to digital converter.

According to a sixth aspect of the present disclosure there is provide a method of operating a digital imaging system comprising the steps of the method of the fifth aspect, wherein the method of operating a digital imaging system further comprises: in a first phase of operation, resetting each pixel sensor in a selected row, and operating the analogue to digital converter in the first mode of operation; and in a second phase of operation, operating the analogue to digital converter in the second mode of operation, and capturing a digital output from the analogue to digital converter.

According to seventh aspect of the present disclosure there is provided a computer program adapted to implement any of the methods of the fourth, fifth or sixth aspect.

According to an eighth aspect of the present disclosure there is provide a computer readable medium incorporating the computer program of the seventh aspect.

In accordance with the present disclosure in a first example there is provided an analogue to digital converter for a digital imaging device comprising a plurality of pixel sensors arranged in a two dimensional matrix, the analogue to digital converter comprising a plurality of read-out capacitors, an operational amplifier and an output register, wherein the output of each pixel sensor in each column of pixel sensors in the matrix is associated with a respective read-out capacitor, and wherein the output of each pixel sensor in each column of pixel sensors is coupled to with a respective addressable output switch. A sensor value of a pixel sensor may be switchably output to a first terminal of the respective read-out capacitor associated with the column to which that pixel belongs when required by operation of the respective output switch, where an input of the operational amplifier is coupled to a second terminal of each read-out capacitor, where an inverting input of the operational amplifier is switchably coupled to an output of the operational amplifier by a mode selection switch. In a first mode of operation during a reset phase the pixel sensor output is connected by a switch to the first terminal of read-out capacitor, and the second terminal is connected to a common mode reference or to the output of the operational amplifier that is coupled to the inverting input such that the operational amplifier operates in a voltage follower mode, whereby the values across the capacitors correspond to a reset value of the pixel sensors. In a second mode during an imaging phase, the inverting input of the operational amplifier is de-coupled from the output of the operational amplifier such that the operational amplifier operates in a comparator mode, whereby any pixel sensor may be activated to output a signal to its respective the capacitor, and the respective capacitor is coupled to the inverting output of the operational amplifier, such that the value on the inverting input corresponds to the stored reset value minus the output signal of the activated pixel sensor at the first terminal of the respective capacitor reflecting the output of the activated pixel sensor is rendered as a digital output value encoded by the timing with which the comparator output toggles from one output extremum to the other in reaction to an analog ramp reference voltage on an non-inverting input of the op amp crossing the voltage value on the inverting input.

In a development of the first example there is provided an analogue to digital converter further comprising a controller configured to couple each capacitor respectively in turn to the inverting output of the operational amplifier, and to sequentially activate each pixel sensor coupled to a respective capacitor to provide a series of digital output values corresponding to each pixel sensor in the matrix in a predetermined sequence.

In a further development of the first example the output of the operational amplifier is provided to the output register synchronized with the sequential activation of pixel sensors.

In a further development of the first example there is provided an analogue to digital converter further comprising a digital ramp analogue to digital converter comprising the operational amplifier operating in the second mode of operation coupled to the read-out capacitors on one input, and a predefined ramping voltage signal on the other.

In a further development of the first example there is provided an device is adapted such that in operation, for each row of the matrix in turn, the addressable output switch is switched to couple each column of pixel sensors to the respective read-out capacitor associated with that column sequentially, and to activate a the pixel in the corresponding row and column for output to the respective read-out capacitor before proceeding to the next row of the matrix, such that the analogue to digital converter outputs digital values representing the charge present at the output of each pixel in a given row in turn, before proceeding correspondingly with the next row, until a value is output for every pixel in the matrix.

In a further development of the first example each pixel sensor is a 4 Transistor per pixel sensor.

In accordance with the present disclosure in a second example there is provided a digital imaging system comprising a device according to the first example, further comprising a controller, the controller configured in a first phase of operation, to reset each pixel sensor in a selected row, and to couple the output of each the pixel sensor in a the selected row to the respective read-out capacitor associated with each pixel sensor, and in a second phase of operation, to sequentially for each pixel sensor in a selected row: couple the output of each pixel sensor in a selected row to the respective read-out capacitor associated with each pixel sensor, and capture a digital output from the analogue to digital converter.

In a development of the second example the controller is further configured to repeat the first phase and the second phase for each row in the matrix.

In a further development of the second example, the digital imaging system further comprises a shift register coupled to the output of each ADC configured to serialize the data output thereby.

In accordance with the present disclosure in a third example, there is provided a method of operating a analogue to digital converter for a digital imaging device comprising a plurality of pixel sensors arranged in a two dimensional matrix, the analogue to digital converter comprising a plurality of read-out capacitors, an operational amplifier and an output register, wherein the output of each pixel sensor in each column of pixel sensors in the matrix is associated with a respective read-out capacitor, and wherein the output of each pixel sensor in each column of pixel sensors is coupled to with a respective addressable output switch, whereby a sensor value of a the pixel sensor may be switchably output to a first terminal of the respective read-out capacitor associated with the column to which that pixel belongs when required by operation of said respective output switch, where an input of the operational amplifier is coupled to a second terminal of each read-out capacitor, where an inverting input of the operational amplifier is switchably coupled to an output of the operational amplifier by a mode selection switch. The method comprises the steps of, in a first mode of operation during a reset phase, coupling the inverting input of the operational amplifier to the output of the operational amplifier such that the operational amplifier operates in a voltage follower mode whereby the values across the capacitors corresponding to a reset value of the pixel sensors is stored as the output value of the operational amplifier. The method further comprises in a second mode during an imaging phase, decoupling the inverting input of the operational amplifier from the output of the operational amplifier such that the operational amplifier operates in a comparator mode, and sequentially coupling each capacitor to receive the output signal of a respective pixel sensor may be activated to output a signal output a signal to its respective capacitor, and to provide the signal to the inverting output of the operational amplifier, such that the value on the inverting input corresponds to the stored reset value minus the output signal of the activated pixel sensor at the first terminal of the respective capacitor reflecting the output of the activated pixel sensor is rendered as a digital output value encoded by the timing with which the comparator output toggles from one output extremum to the other in reaction to an analog ramp reference voltage on an non-inverting input of the op amp crossing the voltage value on the inverting input.

In accordance with the present disclosure in a fifth example, there is provided a method of operating a digital imaging device comprising steps of the third example, and further comprising switching the addressable output switch for each row of the matrix in turn to couple each column of pixel sensors to the respective read-out capacitor associated with that column sequentially, and to activate the pixel in the corresponding row and column for output to the respective read-out capacitor before proceeding to the next row of the matrix, such that the analogue to digital converter outputs digital values representing the charge present at the output of each pixel in a given row in turn, before proceeding correspondingly with the next row, until a value is output for every pixel in the matrix.

In a development of the fourth example the method comprises the further steps of in a first phase of operation, resetting each pixel sensor in a selected row, and coupling the output of each pixel sensor in a selected row to the respective read-out capacitor associated with each pixel sensor, and in a second phase of operation, sequentially for each pixel sensor in a selected row: coupling the output of each pixel sensor in a selected row to the respective read-out capacitor associated with each pixel sensor, and capturing a digital output from the analogue to digital converter.

In accordance with the present disclosure in a fifth example there is provided a computer program adapted to implement the steps of any of the third or fourth examples.

In accordance with the present disclosure in a sixth example there is provided a computer readable medium incorporating the computer program of the fifth example.

Within the scope of this application it is expressly intended that the various aspects, embodiments, examples and alternatives set out in the preceding paragraphs, in the claims and/or in the following description and drawings, and in particular the individual features thereof, may be taken independently or in any combination. That is, all examples or aspects and/or features of any example or aspect can be combined in any way and/or combination, unless such features are incompatible.

BRIEF DESCRIPTION OF THE DRAWINGS

The above and other advantages of the present invention will now be described with reference to the accompanying drawings, in which.

DETAILED DESCRIPTION

An architecture for an analogue to digital converter for a digital imaging device is provided which is able to share N columns coming from the pixel array. A parallel-series architecture optimizes the area and power consumption, being totally compatible with speed requirements in endoscopy sensors.

Figure 1A:
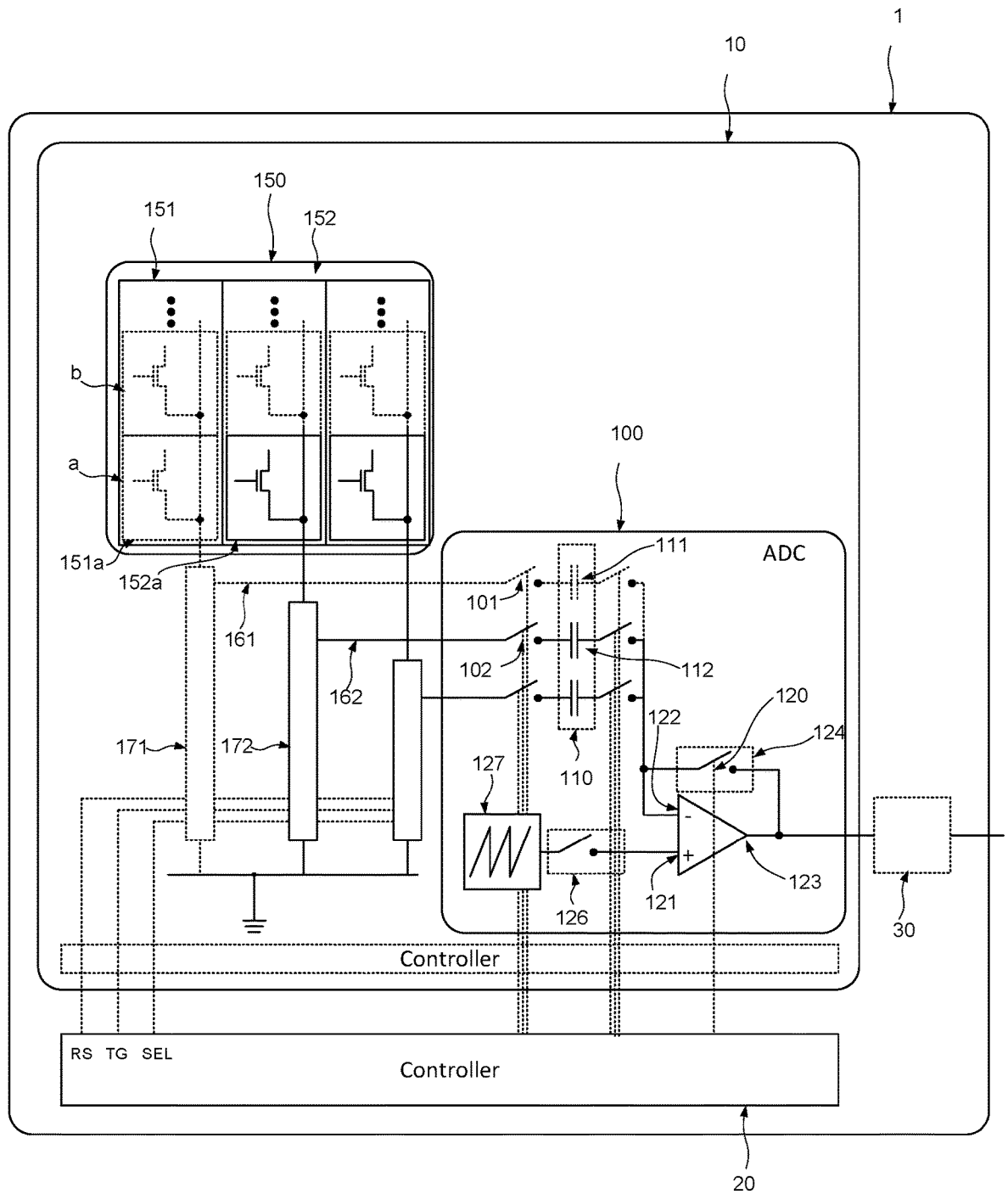
FIG. 1a shows a first embodiment.

FIG. 1a shows a first embodiment.

As shown in FIG. 1a, there is provided a digital imaging system 1, comprising a digital imaging device 10, comprising an ADC 100.

As will become clear in the following description, the digital imaging system 1, digital imaging device 10, and ADC 100 may each constitute embodiments.

An ADC in accordance with these embodiments addresses among others the above stated general objectives:

1. The ADC should be adapted to a very small pixel pitch.
2. The ADC occupied area should be very small.
3. The digital output serialization should be small in area as well.
4. The ADC power consumption should be quite small.

This is generally achieved by embodiments described herein where, N columns share the ADC, providing an optimized architecture in terms of area and speed, because the reset sampling is done in parallel.

The architecture presented achieves these objectives as since the N columns are sharing the ADC, there is no need for extra sample and hold circuitry or column decoder, and CDS may be is performed during the conversion and the ADCs are distributed along the array.

As shown in FIG. 1a there is provided an analogue to digital converter 100 for a digital imaging device comprising a plurality of pixel sensors 151a, 152a arranged in a two dimensional matrix 150 (comprising as shown rows a, b, . . . and columns 151, 152) The pixel sensors themselves may comprise pixel sensors according to any suitable technology as will occur to the skilled person such as 4T (4 Transistor) pixel shared SF, 6T (6 Transistor) pixel global shutter, 5T (5 Transistor) pixel and so forth. As shown, the analogue to digital converter 100 comprises a plurality 110 of read-out capacitors 111, 112, an operational amplifier 120, wherein the output of each pixel sensor 151a, 152a in each column of pixel sensors in the matrix is associated with a respective read-out capacitor 111, 112, and wherein the output of each pixel sensor 151a, 152a in each column 151, 152 of pixel sensors is coupled to a respective addressable output switch 101, 102, whereby a sensor value of the pixel sensor 151a, 152a may be switchably output to a first terminal (e.g. the left hand terminal as shown) of the respective read-out capacitor associated with the column to which that pixel belongs when required, by operation of the respective output switch. The output signal may be conditioned by a respective signal conditioning circuit 171, 172. Depending on the structure of the Pixel circuit, suitable circuits may comprise a simple current source circuit as known to the skilled person, or more elaborate circuits as described below.

As shown, an inverting input 122 of the operational amplifier 120 is coupled to a second terminal (e.g. the right hand terminal as shown) of each read-out capacitor 111, 112. In the arrangement of FIG. 1a the inverting input 122 is also switchably coupled to an output of the operational amplifier by a mode selection switch 124. A non-inverting input 121 of the operational amplifier 120 is switchably coupled to a ramp signal source 127.

In a first mode of operation during a reset phase, the inverting input of the operational amplifier is coupled to the output of the operational amplifier (by closing the mode selection switch 124) such that the operational amplifier operates in a voltage follower mode whereby the values across the capacitors corresponding to a reset value of the pixel sensors is stored as the output value of the operational amplifier. This general mode of operation in Operational Amplifiers is known to the skilled person, see for example Circuits Devices and Systems, Fourth Edition, Ralph J Smith, John Wiley and Sons, ISBN 0-471-805-16-5, page 441.

A particular benefit of this approach is that it provides an auto zeroing behavior.

As such, the ADC samples simultaneously the reset level coming from the pixels saving timing in the readout operation.

Accordingly, the converter consists of N capacitors, each one being connected to the pixel column being sampled in a row basis. The other terminal of each capacitor is connected to an operational amplifier, that works as a voltage follower amplifier when working in closed-loop when the converter is in sampling reset phase. At this moment, the amplifier stores the offset in the capacitors at the same time of sampling. This operation is known as auto-zero. An advantage of this approach is the reduction of offset mismatch between ADCs along the pixel array, and it is translated into a reduction of fixed pattern noise in the image. Another advantage of the auto-zero operation is reduction of the low frequency noise of amplifier.

In a second mode during an imaging phase, the inverting input of the operational amplifier is de-coupled from the output of the operational amplifier (by opening the mode selection switch 124) such that the operational amplifier 120 operates in a comparator mode. This mode of operation is known to the skilled person, see for example Circuits Devices and Systems, Fourth Edition, Ralph J Smith, John Wiley and Sons, ISBN 0-471-805-16-5, page 445.

In this second mode, any pixel sensor may be activated to output a signal to its respective capacitor, and the respective capacitor coupled to the inverting input 122 of the operational amplifier, such that the value on the inverting input corresponds to the stored reset value minus the output signal of the activated pixel sensor at the first terminal of the respective capacitor reflecting the output of the activated pixel sensor is rendered as a digital output value encoded by the timing with which the comparator output toggles from one output extremum to the other in reaction to an analog ramp reference voltage provided for example by ramp signal source 127 on an non-inverting input of the op amp crossing the voltage value on the inverting input.

On this basis, the ADC may further comprising a digital ramp analogue to digital converter comprising the operational amplifier operating in the second mode of operation coupled to the read-out capacitors on one input, and a predefined ramping voltage signal e.g. as provided by ramp signal source 127 on the other.

Thus, the signal level coming from the pixel is read sequentially, subtracting the previously sampled reset in a process known as "correlated double-sampling" (CDS) ensuring good image quality and low dark noise at the output of digitalized output.

In the conversion phase, the amplifier is working in open-loop and operate as a comparator. In this case the pixel sets the output voltage in one terminal of the capacitor connected to the column, and then it moves the voltage at the other terminal according to the difference with the reset level previously sampled. With this subtraction, the ADC is performing the CDS operation. In the other comparator terminal the analog ramp reference starts moving, and when crossing the voltage level in vn, the comparator toggles and the digital counter is sampled e.g. in an output register 30 as described below.

As described above, the capacitors 111, 112, . . . are selectively coupled to the pixel column values on one hand and the op amp on the other by the operation of input and output switches. The coordinated control of these switches may be ensured by a controller 20 configured to couple each capacitor respectively in turn to the inverting output of the operational amplifier, and to sequentially activate each pixel sensor coupled to a respective capacitor to provide a series of digital output values corresponding to each pixel sensor in the matrix in a predetermined sequence. This controller 20 may be a component of the ADC 100, the imaging device 10, or as shown of the broader system, 1.

The controller 20 may be further configured in a first phase of operation, to reset each pixel sensor in a selected row, and to couple the output of each pixel sensor in a selected row to the respective read-out capacitor associated with each pixel sensor, and in a second phase of operation, to sequentially for each pixel sensor in a selected row: couple the output of each pixel sensor in a selected row to the respective read-out capacitor associated with each pixel sensor, and capture a digital output from the analogue to digital converter.

The controller 20 may be further configured to repeat the first phase and the second phase for each row in the matrix.

The proposed structure is able to perform the CDS operation with very low noise because the reset value of every pixel is stored in every capacitor, and then the signal level is converted with respect to the stored reset value, achieving true CDS and thereby low noise.

To further improve the noise level we can use larger capacitors (capacitors with a higher capacitance) and/or number of bits in the conversion The system 1, or device 10, may additionally comprise an output register 30 coupled to the output of the ADC, and in the case where a plurality of matrices with respective ADCs is provided, to each ADC, configured to serialize the data output thereby.

The ADC 100 may additionally comprise an output register 30 synchronized with the sequential activation of pixel sensors. This output register may comprise a shift register whose length corresponds to the number of columns in a row, or the number of pixels in the matrix, as a convenient mechanism to serialise the outputs of the ADC. The value of each flip-flop in the register may be read out in parallel and written to memory, output for image-wise processing, transferred to a second set of registers configured as a shift register to capture the data for sequential output or the like, as desired.

It may be noted that the matrix handled by the ADC may be one of a plurality of similar or identical matrices, each with a respective ADC as described above.

In certain variants, a digital imaging device 10 may comprising the analogue to digital converter 100 as described above, and may be adapted such that in operation, for each row of the matrix in turn, the addressable output switch is switched to couple each column of pixel sensors to the respective read-out capacitor associated with that column sequentially, and to activate the pixel in the corresponding row and column for output to the respective read-out capacitor before proceeding to the next row of the matrix, such that the analogue to digital converter outputs digital values representing the charge present at the output of each pixel in a given row in turn, before proceeding correspondingly with the next row, until a value is output for every pixel in the matrix.

The skilled person will recognize that the pixel sensors themselves may be based on any convenient pixel sensor. Typical circuits include 4, 5 or 6 transistors per pixel. A 4 Transistor per pixel sensor may be particularly suitable.

Figure 1B:
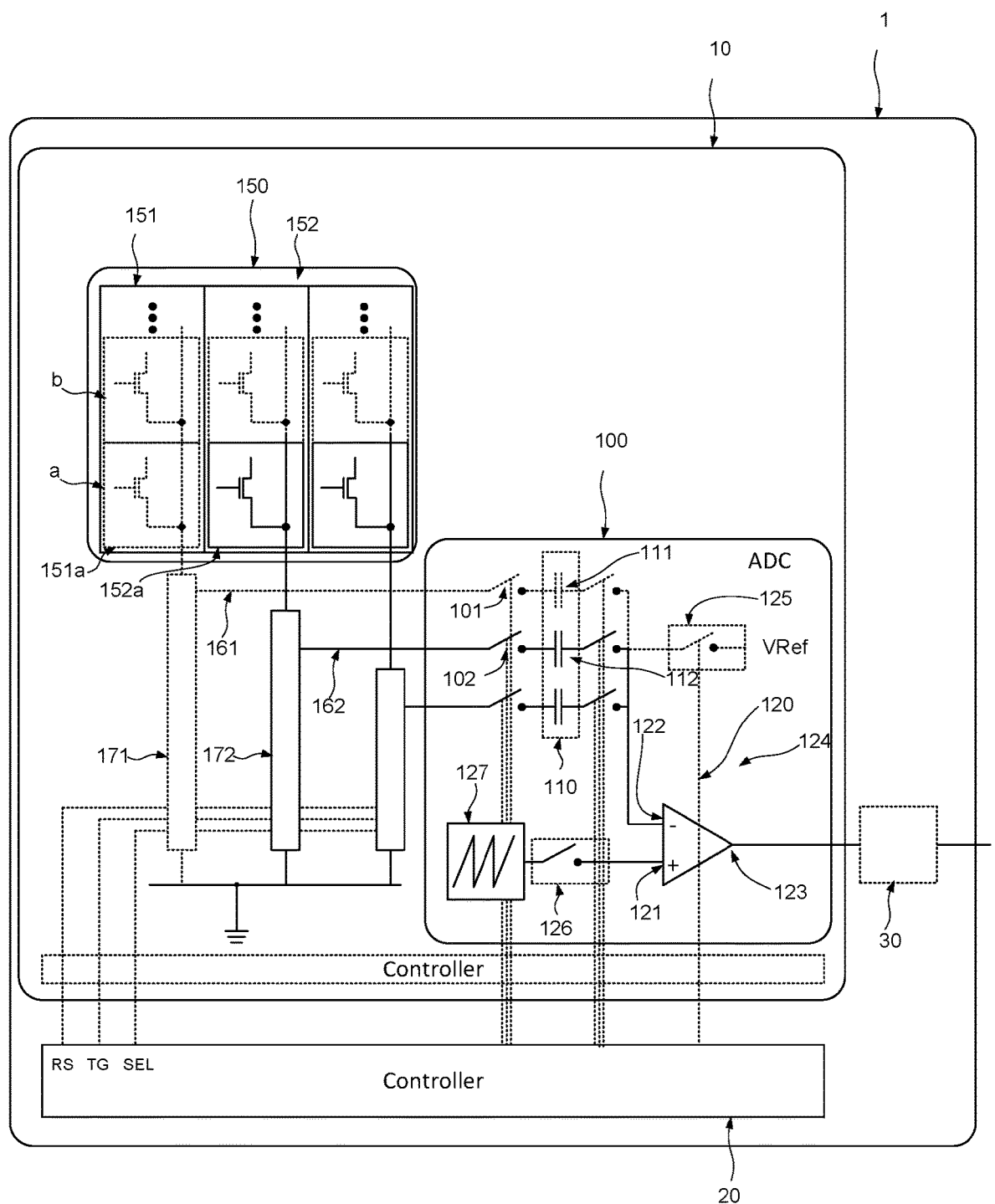
FIG. 1b shows a second embodiment.

FIG. 1b shows an alternative embodiment to the embodiment of FIG. 1a

The system of FIG. 1b is identical to that of FIG. 1a, and correspondingly numbered elements are the same, except that as shown, instead of providing switch 124 as discussed with reference to FIG. 1a, the circuit of FIG. 1b provides for a selectable connection of the inverting input of the opamp 123 to a reference voltage VRef in the first mode of operation, rather than coupling the output of the operational amplifier by closing the mode selection switch 124 such that the operational amplifier operates in a voltage follower mode as discussed above with reference to FIG. 1a. In the second mode of operation, the configuration is as discussed with respect to FIG. 1a.

As such, considering the embodiments of FIGS. 1a and 1b, in the first mode the pixel sensor output may be connected by a switch to the first terminal of read-out capacitor, and the second terminal is connected either to a common reference (for example as discussed with reference to FIG. 1b) or to the output of said operational amplifier that is coupled to said inverting input such that said operational amplifier operates in a voltage follower mode (for example as discussed with reference to FIG. 1b), whereby the values across said capacitors correspond to a reset value of said pixel sensors.

It will be appreciated that while the approaches of FIGS. 1a and 1b have their respective benefits, the approach of FIG. 1a has the particular advantage of providing an autozero operation reducing the column to column offset and the low frequency noise.

It will be appreciated that any of the variants described above with respect to FIG. 1a may be applied mutatis mutandis to the approach of FIG. 1b.

Figure 2:
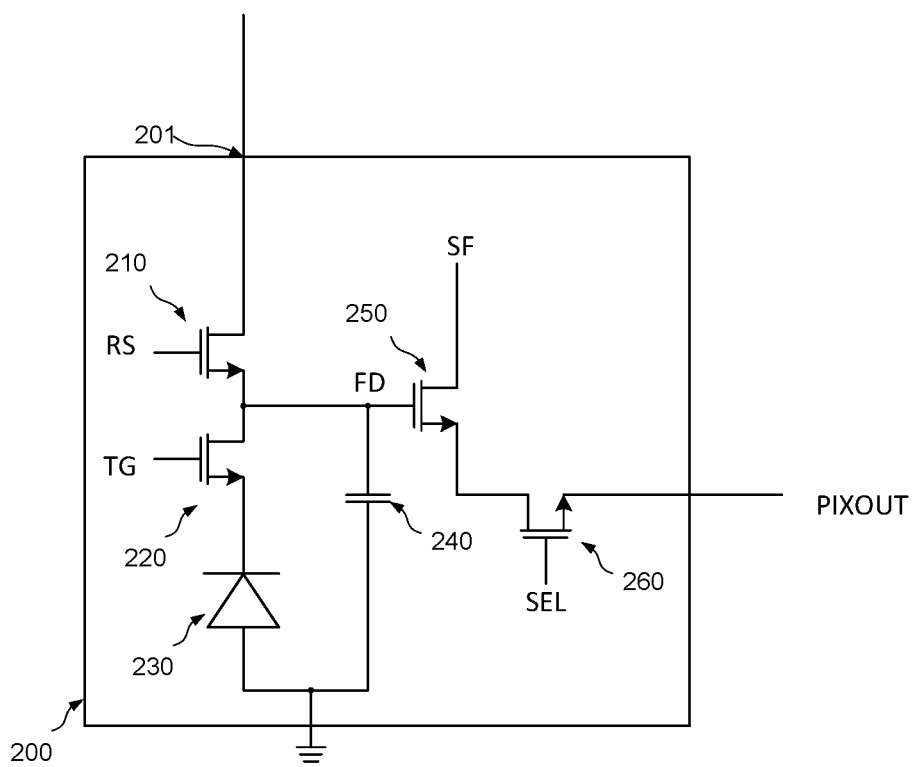
FIG. 2 shows a possible implementation of a signal conditioning circuit as mentioned with reference to FIGS. 1a and 1b.

FIG. 2 shows a possible implementation of a signal conditioning circuit as mentioned with reference to FIG. 1a or 1b.

As shown, the circuit 200 comprises a reset gate 210, comprising an enhanced, N-channel MOSFET with no bulk connection, a TG gate 220, comprising an enhanced, N-channel MOSFET with no bulk connection, a diode 230, a capacitor 240, an SF gate 250, comprising an enhanced, N-channel MOSFET with no bulk connection, and a Select gate 260, comprising an enhanced, N-channel MOSFET with no bulk connection.

The drain of the reset gate 210 receives an input signal voltage from a respective pixel column output 151, 152. The source of the reset gate 210 is connected to the drain of the TG gate 220, to one terminal of the capacitor 240 and to the gate terminal of the Select gate 260. The other terminal of the capacitor 240 is connected to ground. The source of the TG gate 220 is connected to the cathode of the diode 230. The anode of the diode 230 is connected to ground. The drain of the SF gate 250 is connected to control signal SF. The SF gate 250 connected to the drain of Select gate 260. The gate terminal of Select gate 260 is connected to control signal SEL. The source terminal of Select gate 260 provides an output PIXOUT, which feeds into a respective addressable output switch 101, 102 as discussed with reference to FIG. 1a or 1b.

Generally, the circuit 200, as provided at the output of each pixel column, serves to control and coordinate the output of each pixel column, under the influence of control signals RS, TG, SF and SEL, which are common to each such circuit in a given pixel matrix, as will become more clear in the light of the following description.

SF transistor is source follower, it is basically a buffer with a gain close to 1, aprox 0.85-0.9, to work as a buffer needs a current source at the bottom of the pixel array. The goal of this transistor is put voltage at the gate into the output line. The source follower is connected to output line by the SEL transistor, that works as switch. Only one SF can put the data in the column line, then only one SEL transistor in the same column is active in every time we read each row.

The photodiode is in charge of accumulating charge (electrons). When RS and TG (switches) are active the photodiode is depleted, and when TG is off starts the exposure. The RS transistor when readout starts reset the FD node, to a high value, and then it is deactivated and we read the reset value (sampling the capacitors) and after that, TG is active and the accumulated electrons in the photodiode goes to the FD, then the voltage is the FD is moved done according to the amount of electrons. In fact, the conversion from charge to voltage is given by the conversion gain CG (also knows as CVF "charge to voltage factor).

Figure 3:
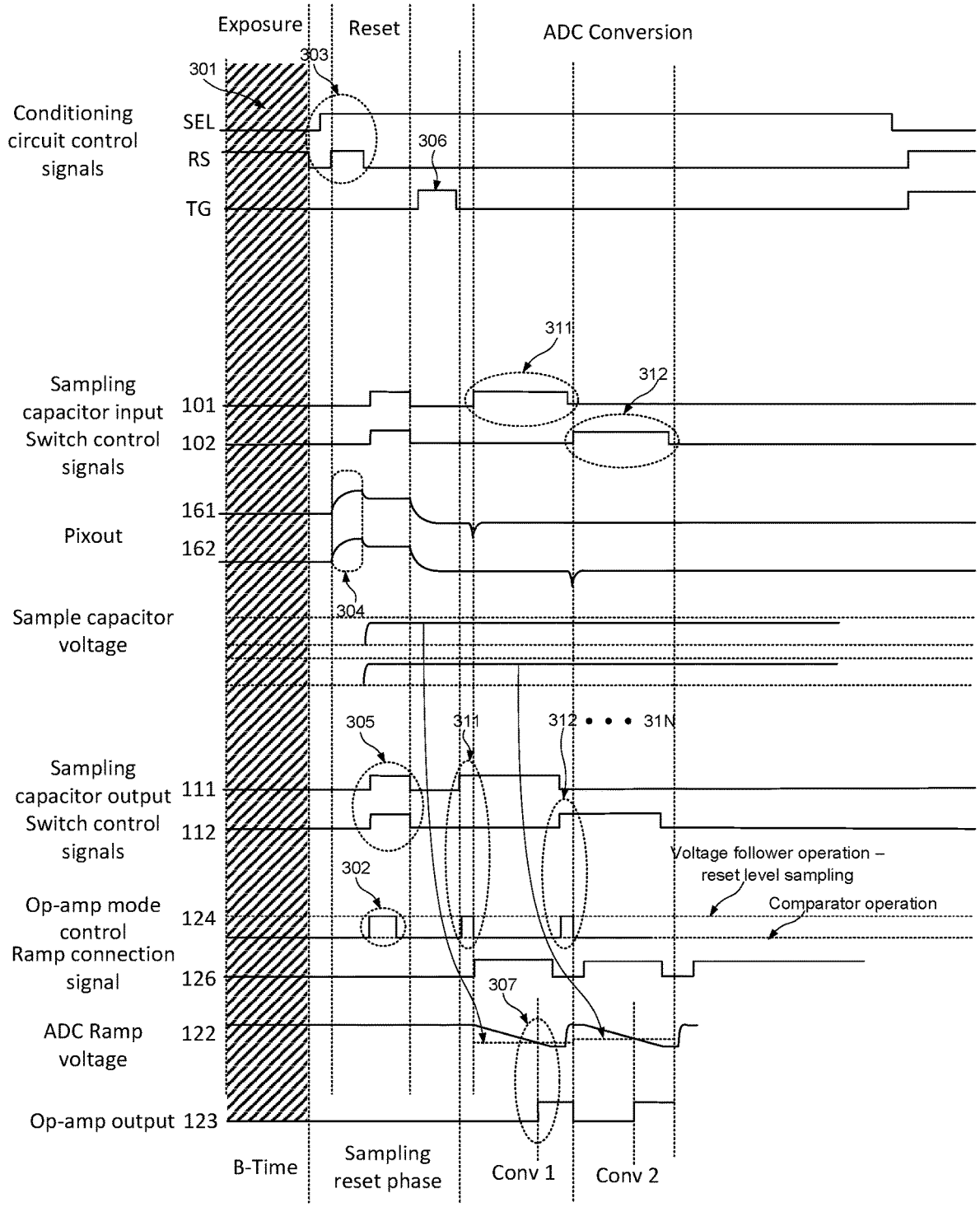
FIG. 3 depicts certain waveforms that may be detectable during operation of the circuit of FIGS. 1a and 1b.

The skilled person will recognize that countless circuits of equivalent function to that of FIG. 3 may be devised.

FIG. 3 depicts certain waveforms that may be detectable during operation of the circuit of certain embodiments.

It may be noted that while FIG. 3 corresponds to the minimal case of two pixel columns, in correspondence to FIGS. 1a and 1b, the sequence may be extended to any desired number of columns, each being sampled in sequence as described below. In particular, FIG. 3 presents the waveforms detectable during operation for control signals RS, TG and SEL.

During an Exposure phase 301, the pixels of the pixel matrix are exposed to a luminous signal. After a defined exposure period, a reset phase ensues.

During a sampling reset phase all phases are active and the op-amp mode is set to voltage follower operation, by setting op-amp mode control signal 124 to High, as shown at reference 302.

At that moment, the RST value of pixels is sampled in the capacitors, by closing gates 210 and 260 by the setting the Sel and RS signals to logical High as shown at reference 303 to enable output of the pixel signals for the current row of all columns of the pixel matrix. The output voltage pixout ramps up as shown at reference 304 as the respective sampling capacitors 101, 102 are charged by the pixel outputs.

The sampling switches 111, 112 are then closed, by setting the values of sampling capacitor output switch values 111, 112 set to logical High as shown at reference 305.

Accordingly, the inverting input of the operational amplifier is coupled to the output of the operational amplifier such that the operational amplifier operates in a voltage follower mode whereby the values across the capacitors corresponding to a reset value of the pixel sensors is stored as the output value of the operational amplifier.

A conversion phase for every pixel of the N columns then starts for each pixel column in turn.

A short positive pulse 306 on transfer signal TG is performed to transfer the charge from the photodiode to the FD, once the reset value is read.

For a given pixel column, a small pulse 311 ... 312 ... 31N setting the op amp mode to voltage follower configuration coincides with the closing of the respective sampling capacitor output switch 111, 112 ... 11N for the column in question, setting the starting point to the common mode reference, so that the parasitic capacitances of the circuit are charged to the same value at the starting of the conversion. If this parasitic capacitance is not reset in every comparison, then there is a memory effects from one conversion to the previous one. The op amp mode signal 124 reverts to the comparator configuration while the respective sampling capacitor output switch 111 remains closed. During this period, the Ramp connection signal operating switch 126 goes to logical high, closing the switch 126 and exposing the non-inverting input 121 of the opamp 120 to a Ramp voltage signal descending at a substantially continuous rate from a high reference voltage to zero. Meanwhile, a digital counter is decremented at a continuous rate from a maximum value to zero, such that the zero is reached simultaneously with the ramp voltage reaching zero, and the ramp connection signal reverting to zero so as to disconnect the non-inverting input 121 of the opamp 120 from the Ramp voltage signal.

When the ramp input on the non-inverting input 121 crosses the voltage on the inverting input 122 as stored on the corresponding capacitor 111, 112, represented by dotted line 307, the op-amp 120 output toggles from negative saturation to positive saturation. This toggling triggers the transfer of the counter value at the instant in question into the output register 130 as a digital representation of the analogue value originally output by the pixel in the row and column currently under consideration.

Accordingly, each pixel sensor is activated in sequence to output a signal to its respective capacitor, and the respective capacitor is coupled to the inverting output of the operational amplifier, such that the value on the inverting input corresponds to the stored reset value minus the output signal of the activated pixel sensor at the first terminal of the respective capacitor reflecting the output of the activated pixel sensor is rendered as a digital output value encoded by the timing with which the comparator output toggles from one output extremum to the other in reaction to an analog ramp reference voltage on an non-inverting input of the op amp crossing the voltage value on the inverting input.

As shown, the process reverts to initiative the next small pulse 311 ... 312 ... 31N, and repeats the preceding steps for the next column in the set of outputs stored in the capacitors 111 ... 112, and so on until all columns have been sampled.

The process is then repeated for the next row of pixels, until all pixels in the matrix have been sampled. The process may then be repeated for a subsequent image.

In these waveforms are shown also the control signal for a typical 4T pixel working in rolling shutter.

The skilled person will appreciate that the presented details may be modified mutatis mutandis for other pixel architectures and other shutter modes. For example if the pixel is 6T global shutter pixel with memory node, then nothing changes. However if the pixel is 5T global shutter then first you do the transfer and then the reset. It means that the first value is the signal, and the second the reset value. The reset value is always higher than signal value, then we may need to do an inverted analog ramp, from low value to high value. In the current approach is from high to low value. I guess the architecture does not change.

Accordingly, the ADC may simultaneously sample the reset level coming from the pixels saving timing in the readout operation. Furthermore, the signal level coming from a given pixel is read in sequential order subtracting the previous sampled reset in a process known as "correlated double-sampling" (CDS) ensuring good image quality, low dark noise at the output of digitalized output.

Figure 4:
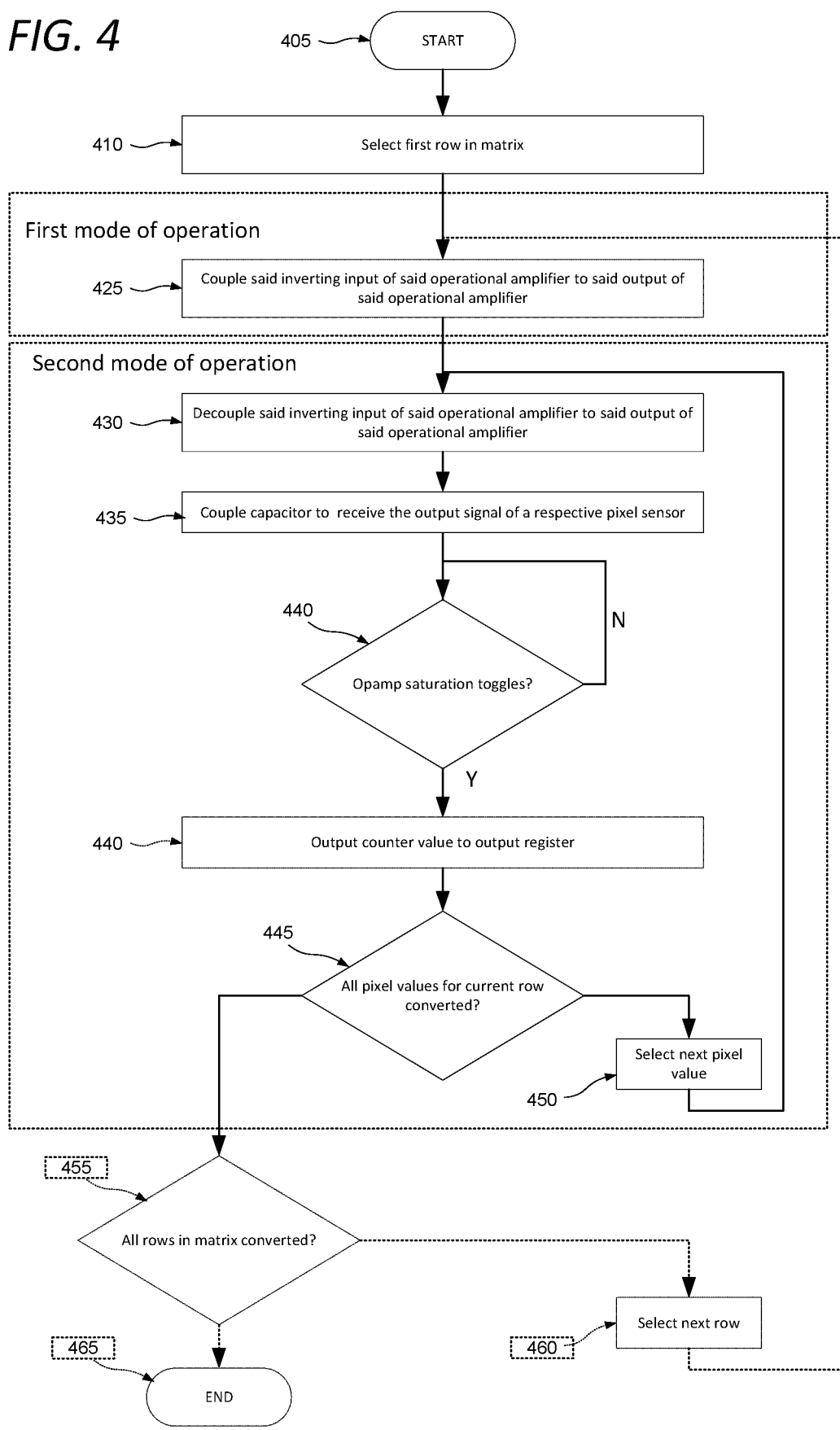
FIG. 4 presents steps of a method of operation of an ADC circuit in accordance with an embodiment.

FIG. 4 presents steps of a method of operation of an ADC circuit in accordance with an embodiment.

Embodiments may take the form of a method corresponding to the operations described with above, and in particular with reference to FIG. 3. FIG. 4 presents such a method.

As such, there is provided a method of operating a analogue to digital converter for a digital imaging device comprising a plurality of pixel sensors arranged in a two dimensional matrix, the analogue to digital converter comprising a plurality of read-out capacitors, an operational amplifier and an output register, wherein the output of each pixel sensor in each column of pixel sensors in the matrix is associated with a respective read-out capacitor, and wherein the output of each pixel sensor in each column of pixel sensors is coupled to with a respective addressable output switch, whereby a sensor value of a pixel sensor may be switchably output to a first terminal of the respective read-out capacitor associated with the column to which that pixel belongs when required by operation of the respective output switch, where an input of the operational amplifier is coupled to a second terminal of each read-out capacitor, where an inverting input of the operational amplifier is switchably coupled to an output of the operational amplifier by a mode selection switch The method starts at step 405 before proceeding to step 410 at which a first row in the matrix is selected. At step 410, in a first mode of operation during a reset phase, the inverting input of the operational amplifier is coupled to the output of the operational amplifier such that the operational amplifier operates in a voltage follower mode whereby the values across the capacitors corresponding to a reset value of the pixel sensors is stored as the output value of the operational amplifier, e.g. as discussed above.

The method then proceeds to step 430, where in a second mode during an imaging phase, the inverting input of the operational amplifier is decoupled from the output of the operational amplifier such that the operational amplifier operates in a comparator mode. The method then proceeds to step 435 at which the capacitor corresponding to the current column is coupled to receive the output signal of a respective pixel sensor (whose output may be correspondingly activated by the larger system to which the ADC belongs). The method then proceeds to step 440 at which it is determined whether the op-apt saturation has toggled. The skilled person will appreciate that there are exist many comparator based ADC mechanisms, including the direct conversion, successive appreciation, ramp compare, Wilkinson, delta-encoded and so forth, as will be known to the skilled person, of which any may be adapted to the present invention. As such, the determination whether the op-amp has toggled or not is an indicator of a digital output value encoded by the timing with which the comparator output toggles from one output extremum to the other in reaction to an analog ramp reference voltage on an non-inverting input of the op amp crossing the voltage value on the inverting input.

If the op-amp saturation does not toggle, the method loops on step 440 until it does toggle, whereupon the method proceeds to step 440 at which the indicator of a digital value of the rendered as a digital output value encoded by the timing with which the comparator output toggles from one output extremum to the other in reaction to an analog ramp reference voltage on an non-inverting input of the op amp crossing the voltage value on the inverting input. The method then proceeds to step 440 at which this value may be output. The method then proceeds to step 445 at which it is determined whether all pixel values for the current row have been converted. If all pixel values for the current row have not been converted the method proceeds to step 450 at which the next pixel in the current row is selected, and then loops back to step 430.

Accordingly, each capacitor is sequentially coupled to receive the output signal of a respective pixel sensor, which may be activated to output a signal output a signal to its respective capacitor, and to provide the signal to the inverting output of the operational amplifier, such that the value on the inverting input corresponds to the stored reset value minus the output signal of the activated pixel sensor at the first terminal of the respective capacitor reflecting the output of the activated pixel sensor.

The method may then optionally proceed to step 455 at which it is determined whether all rows in the matrix have been converted, and in a case where all rows in the matrix have not been converted, the method may proceed to step 460 at which a new row is selected, or otherwise terminate at step 465.

It will be appreciated that the sequence of steps of FIG. 4 may be reordered without changing the underlying logic of the process. For example, steps 430 and 435 may be performed in any order.

Figure 5:
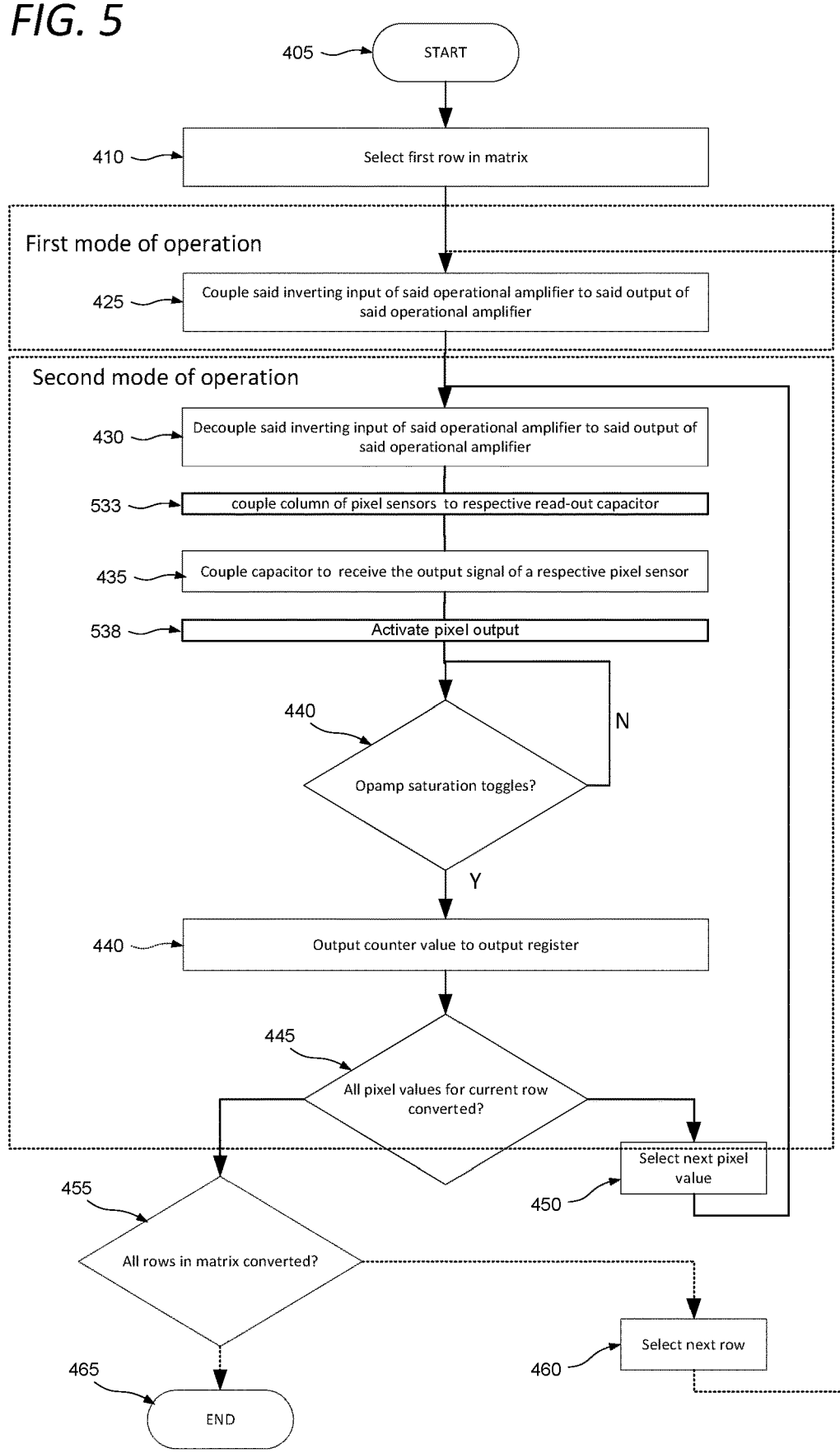
FIG. 5 presents steps of a method of operation of an digital imaging device incorporating an ADC circuit in accordance with an embodiment.

FIG. 5 presents steps of a method of operation of a digital imaging device incorporating an ADC circuit in accordance with an embodiment.

Embodiments may take the form of a method corresponding to the operations described with above, and in particular with reference to FIG. 3. FIG. 5 presents such method.

The method FIG. 5 corresponds substantially to that of FIG. 4, with like numbered features corresponding.

The method of FIG. 5 relates to a method of operating a digital imaging device comprising steps of the method of operating an analogue to digital converter as described above, the digital imaging device incorporating an analogue to digital converter as described with respect to FIG. 4. The method of operating a digital imaging device additionally comprises a step 533, situated immediately after step 430, of switching the addressable output switch to couple the column of pixel sensors to the respective read-out capacitor associated with that column and step, and a step 538, situated immediately after step 535, to activate the pixel in the corresponding the row and column for output to the respective read-out capacitor.

Accordingly, the addressable output switch is switched for each row of the matrix in turn to couple each column of pixel sensors to the respective read-out capacitor associated with that column sequentially, and the pixel activated in the corresponding row and column for output to the respective read-out capacitor before proceeding to the next row of the matrix, such that the analogue to digital converter outputs digital values representing the charge present at the output of each pixel in a given row in turn, before proceeding correspondingly with the next row, until a value is output for every pixel in the matrix.

It will be appreciated that the sequence of steps of FIG. 5 may be reordered without changing the underlying logic of the process. For example, steps 435, 536 and 538 may be performed in any order.

Figure 6:
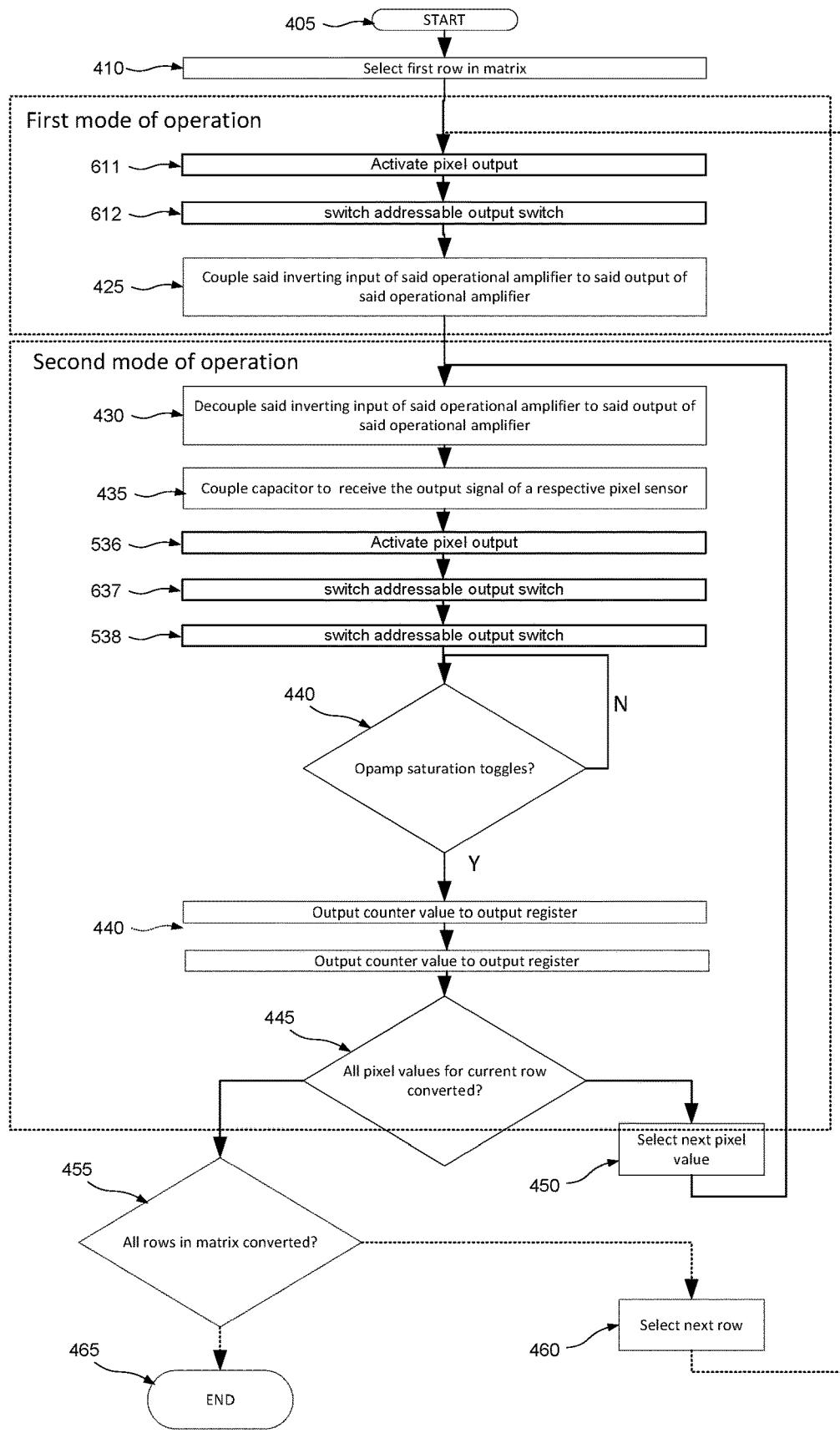
FIG. 6 presents steps of a method of operation of a digital imaging system incorporating a digital imaging device accordance with an embodiment.

FIG. 6 presents steps of a method of operation of a digital imaging system incorporating a digital imaging device accordance with an embodiment.

Embodiments may take the form of a method corresponding to the operations described with above, and in particular with reference to FIG. 3. FIG. 6 presents such a method.

The method FIG. 6 corresponds substantially to that of FIG. 4, with like numbered features corresponding.

The method of FIG. 6 relates to a method of operating a digital imaging system comprising the steps of the method of operating a digital imaging device of FIG. 5, the system comprising the device as described with reference to FIG. 5.

The method of operating a digital imaging system additionally comprises the further steps of, in the first phase of operation, resetting each pixel sensor in a selected row at step 611, and coupling the output of each pixel sensor in the selected row to the respective read-out capacitor associated with each pixel sensor at step 612, immediately before step 425.

The method of operating a digital imaging system additionally comprises the further steps of, in the a second phase of operation, at a step 637, between steps 536 and 538, coupling the activated pixel sensor to the respective read-out capacitor associated with each pixel sensor, and at a step 441, capturing a digital output from the analogue to digital converter.

Accordingly, for each pixel sensor in a selected row may be sequentially coupled to the output of each pixel sensor in a selected row to the respective read-out capacitor associated with each pixel sensor.

Accordingly, while prior art architectures provide one ADC element per column including separate sampling elements for reset level and signal level. Embodiments meanwhile remove the separate signal level element, and only use one comparator for every N columns providing a highly compact architecture while keeping image quality at optimum levels with true CDS operation.

Embodiments may be implemented based on 65 nm node specialized in CIS (Contact Image Sensor) technology.

Results obtained from such an embodiment are presented in the following table, in comparison with implementations as known from certain prior art circuits, as follows:

Example 1: M. Vatteroni, et al., "Smart optical CMOS sensor for endoluminal applications", Eurosensors XXIII, 2009.

Example 2: M. Wäny, et al., "Ultrasmall digital image sensor for endoscopic applications", in Proc. Int. Image Sensor Workshop, June 2009, pp. 1-4.

Example 3: S. Itoh, S. Kawahito, S. Terakawa, "A 2.6 mW 2 fps QVGA CMOS one-chip wireless camera with digital image transmission function for capsule endoscopes"

Example 4: M. Wäny, et al., "NanEye—An Endoscopy Sensor With 3-D Image Synchronization", IEEE sensors journal, 2017.

Results

| Performances | Units | Prior art examples | | | | Embodiment |
| --- | --- | --- | --- | --- | --- | --- |
| | | Example 1 | Example 2 | Example 3 | Example 4 | |
| Die Size | mm × mm | 2.5 × 3.0 | 0.6 × 0.6 | 4.84 × 4.34 | 1 × 1 | 2.0 × 2.0 |
| Pixel | um | 4.4 | 3.0 | 10 | 3 | 1.75 |
| Pixel array | # | 320 × 240 | 100 × 100 | 320 × 240 | 250 × 250 | 790 × 700 |
| Frame Rate | fps | 30 | 40 | 2 | 62 | 60 |
| Power consumption | mW | 40 | 26 | 2.6 | 11.5 | 73 |
| Bit Resolution | # | 10 | 8 | 10 | 10 | 10 |
| DR | dB | 50 | 46.5 | — | — | 60 |
| Pixel Rate | Mpxel/seg | 2.304 | 0.4 | 0.153 | 3.875 | 32 |
| Energy per Pixel | nJ | 17.36 | 65 | 16.9 | 3.06 | 2.23 |

It may be observed that the implementation in accordance with embodiments provides substantially superior overall performance, and in particular the best performance in terms of pixel rate and power consumption.

Accordingly, there is provided an analogue to digital converter for digital imaging devices, in which pixel column is sampled by a respective capacitor.

In a reset phase of operation, each pixel in the row under consideration is reset, and an operational amplifier operating in a voltage follower mode is coupled to all the sampling capacitors in parallel to obtain the common reset value of the pixels sensors of that row, and the in an imaging phase of operation, the inverting input of the operational amplifier operating in a comparator mode is coupled to each capacitor in turn after activating the respective pixel sensor, while exposing the non inverting signal to an analog ramp reference voltage so that the timing of the toggling of the operational amplifier reflects the value of the pixel under consideration, corrected for the reset value.

The disclosed implementations as regards can take form of an entirely hardware embodiment, an entirely software embodiment for example as regards the methods described above or an embodiment containing both hardware and software elements. Software embodiments include but are not limited to firmware, resident software, microcode, etc. The invention can take the form of a computer program product accessible from a computer-usable or computer-readable medium providing program code for use by or in connection with a computer or an instruction execution system. A computer-usable or computer-readable can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium.

These methods and processes may be implemented by means of computer-application programs or services, an application-programming interface (API), a library, and/or other computer-program product, or any combination of such entities.

As such, there is provided a program for a computer comprising instructions adapted to implement the steps of the method of operating the charging device and/or the method of operating the reporting device as set out above, or more generally and the operations described above, for example with respect to FIGS. 4 to 6.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. An analogue to digital converter for a digital imaging device comprising a plurality of pixel sensors arranged in a two-dimensional matrix comprising a plurality of columns of pixel sensors, said analogue to digital converter comprising:
   a plurality of read-out capacitors, each of the plurality of read-out capacitors being associated with a respective column of pixel sensors;
   a first plurality of addressable output switches, wherein each of the first plurality of addressable output switches is arranged to switchably couple an output of a pixel sensor in a column of the pixel sensor matrix to a first terminal of the read-out capacitor associated with that column;
   an operational amplifier comprising an inverting input coupled to second terminals of the plurality of read-out capacitors and a non-inverting input;
   a ramp signal source switchably coupled to the non-inverting input of the operational amplifier, wherein the ramp signal source is configured to output a ramping reference voltage; and
   a mode selection switch arranged to switchably couple and de-couple the inverting input of the operational amplifier to a common reference voltage or the output of the operational amplifier, wherein
   a controller is configured to control the first plurality of addressable switches such that the analogue to digital converter sequentially operates in a first mode of operation during which pixel sensors in a selected row of the pixel sensor matrix output reset values and a second mode of operation during which the pixel sensors in the selected row of the pixel sensor matrix output signal values, and wherein:
   a. in the first mode of operation, the first plurality of addressable output switches are closed such that the pixel sensor outputs in the selected row and in each column are simultaneously connected to the first terminals of the plurality of read-out capacitors, and the mode selection switch is closed such that the inverting input of the operational amplifier is connected to the common reference voltage or to the output of the operational amplifier, such that the outputs of the pixel sensors in the row are read out in parallel and the reset values of the pixels sensors in the row are stored in their respective read-out capacitor; and
   b. in the second mode of operation, the mode selection switch is opened to de-couple the inverting input from the output of the operational amplifier or the reference voltage such that the operational amplifier operates in a comparator mode, and the first plurality of addressable output switches are sequentially closed to sequentially couple the outputs of the pixel sensors in each column and in the selected row to the first terminals of their respective read-out capacitors whilst the second terminals of the plurality of read-out capacitors are coupled to the inverting input of the operational amplifier and the non-inverting input of the operational amplifier is coupled to the ramp signal source, such that for each pixel sensor whose output is sequentially coupled to the first terminal of its associated read-out capacitor, the value on the inverting input of the operational amplifier corresponds to the reset value stored in the respective read-out capacitor minus the output signal of the pixel sensor in the respective column and said value on the inverting input of the operational amplifier is rendered as a digital output value encoded by a timing with which the output of the operational amplifier toggles from one output extremum to the other.

2. The analogue to digital converter of claim 1 wherein the output of the operational amplifier is provided to an output register synchronized with the sequential coupling of the outputs of the pixel sensors in each column and in the selected row to the first terminals of their respective read-out capacitors.

3. The analogue to digital converter of claim 1, further comprising the controller.

4. The digital imaging device of claim 1 comprising the analogue to digital converter of claim 1, wherein the digital imaging device is configured to select each row of the matrix of pixel sensors in turn and operate the converter in the first mode and the second mode for each row such that the analogue to digital converter outputs digital values representing the reset value minus the signal value of each pixel in a selected row in turn, before proceeding correspondingly with the next row, until a digital value is output for every pixel in the matrix.

5. The digital imaging device of claim 4 wherein each pixel sensor comprises a 4 transistor per pixel sensor.

6. The digital imaging device of claim 4, further comprising the controller, wherein the controller is further configured to control the pixel sensors to output a reset value during the first mode of operation of the analogue to digital converter and to output a signal value during the second mode of operation of the analogue to digital converter.

7. A digital imaging system comprising the digital imaging device according to claim 4, wherein the digital imaging system comprises the controller and the controller is further configured to:
in a first phase of operation, to reset each said pixel sensor in a selected row, and to operate the analogue to digital converter in the first mode of operation; and
in a second phase of operation, operate the analogue to digital converter in the first mode of operation, and capture a digital output from the analogue to digital converter.

8. The digital imaging system according to claim 7, wherein the controller is further configured to repeat said first phase and said second phase for each row in the matrix.

9. The digital imaging system according to claim 7 comprising a shift register coupled to the output of the analogue to digital converter and configured to serialize data output from the analogue to digital converter.

10. A method of operating an analogue to digital converter for a digital imaging device comprising a plurality of pixel sensors arranged in a two-dimensional matrix comprising a plurality of columns of pixel sensors, wherein the analogue to digital converter comprises: a plurality of read-out capacitors, each of the plurality of read-out capacitors being associated with a respective column of pixel sensors, an operational amplifier comprising an inverting input coupled to second terminals of the plurality of read-out capacitors and a non-inverting input; and a ramp signal source switchably coupled to the non-inverting input of the operational amplifier,
wherein the method comprises sequentially operating the analogue to digital converter in a first mode of operation during which pixel sensors in a selected row of the pixel sensor matrix output reset values and a second mode of operation during which the pixel sensors in the selected row of the pixel sensor matrix output signal values, wherein:
a. the first mode of operation comprises: connecting pixel sensor outputs in the selected row and in each column to first terminals of the plurality of read-out capacitors in parallel with each other, and connecting the inverting input of the operational amplifier to a common reference voltage or to the output of the operational amplifier, such that the outputs of the pixel sensors in the row are read out in parallel and the reset values of the pixels sensors in the row are stored in their respective read-out capacitor, and
b. the second mode of operation comprises: de-coupling the inverting input from the output of the operational amplifier or the reference voltage such that the operational amplifier operates in a comparator mode, and sequentially coupling the outputs of the pixel sensors in each column and in the selected row to the first terminals of their respective read-out capacitors whilst the second terminals of the plurality of read-out capacitors are coupled to the inverting input of the operational amplifier and the non-inverting input of the operational amplifier is coupled to the ramp signal source which outputs a ramping reference voltage, such that for each sequentially coupled pixel sensor output, the value on the inverting input of the operational amplifier corresponds to the reset value stored in the respective read-out capacitor minus the output signal of the pixel sensor in the respective column and said value on the inverting input of the operational amplifier is rendered as a digital output value encoded by a timing with which the output of the operational amplifier toggles from one output extremum to the other.

11. A method of operating a digital imaging device comprising the steps of the method of operating an analogue to digital converter of claim 10, said method of operating a digital imaging device comprising:
selecting each row of the matrix of pixel sensors in turn and operating the converter in the first mode and the second mode for each row such that the analogue to digital converter outputs digital values representing the reset value minus the signal value of each pixel in a selected row in turn, before proceeding correspondingly with the next row, until a digital value is output for every pixel in the matrix.

12. The method of operating a digital imaging device according to claim 11, further comprising:
controlling the pixel sensors in a selected row to output reset values during the first mode of operation of the analogue to digital converter; and
controlling the pixel sensors in the selected row to output signal values during the second mode of operation of the analogue to digital converter.

13. A method of operating a digital imaging system comprising the steps of the method of operating a digital imaging device of claim 11, wherein the method of operating a digital imaging system further comprises:
in a first phase of operation, resetting each pixel sensor in a selected row, and operating the analogue to digital converter in the first mode of operation; and
in a second phase of operation, operating the analogue to digital converter in the second mode of operation, and capturing a digital output from the analogue to digital converter.

14. A non-transitory computer readable medium incorporating a computer program adapted to implement the method of claim 10.

* * * * *

UNITED STATES PATENT AND TRADEMARK OFFICE
CERTIFICATE OF CORRECTION

| | |
|---|---|
| PATENT NO. | : 12,069,389 B2 |
| APPLICATION NO. | : 17/980194 |
| DATED | : August 20, 2024 |
| INVENTOR(S) | : Jose Angel Segovia de la Torre et al. |

It is certified that error appears in the above-identified patent and that said Letters Patent is hereby corrected as shown below:

In the Claims

Claim 13, Column 24, Line 40, change "imaging device of claim 11, wherein" to -- imaging device of claim 12, wherein --.

Signed and Sealed this
Twenty-second Day of October, 2024

Katherine Kelly Vidal
*Director of the United States Patent and Trademark Office*